United States Patent
Kobayashi et al.

(10) Patent No.: US 7,710,027 B2
(45) Date of Patent: May 4, 2010

(54) LIGHT EMITTING APPARATUS INCLUDING RESIN BANKS AND ELECTRONIC DEVICE HAVING SAME

(75) Inventors: Hidekazu Kobayashi, Hara-mura (JP); Satoru Miyashita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 501 days.

(21) Appl. No.: 11/808,229

(22) Filed: Jun. 7, 2007

(65) Prior Publication Data

US 2007/0236139 A1 Oct. 11, 2007

Related U.S. Application Data

(63) Continuation of application No. 10/420,829, filed on Apr. 23, 2003, now Pat. No. 7,242,140.

(30) Foreign Application Priority Data

May 10, 2002 (JP) ............................. 2002-136241

(51) Int. Cl.
*H01J 1/62* (2006.01)
(52) U.S. Cl. .................................. 313/506
(58) Field of Classification Search .......... 313/498–512
See application file for complete search history.

(56) References Cited

U.S. PATENT DOCUMENTS

| 5,049,780 | A * | 9/1991 | Dobrowolski et al. ....... 313/509 |
| 5,521,759 | A * | 5/1996 | Dobrowolski et al. ....... 359/585 |
| 6,194,837 | B1 | 2/2001 | Ozawa |
| 6,259,423 | B1 | 7/2001 | Tokito et al. |
| 6,411,019 | B1 | 6/2002 | Hofstra et al. |
| 6,545,424 | B2 | 4/2003 | Ozawa |
| 6,551,651 | B2 * | 4/2003 | Hofstra et al. .............. 313/504 |
| 6,608,333 | B1 | 8/2003 | Lee et al. |
| 6,784,602 | B2 * | 8/2004 | Hofstra et al. .............. 313/112 |
| 7,196,468 | B2 * | 3/2007 | Fukuda ...................... 313/506 |
| 7,495,385 | B2 * | 2/2009 | Lee et al. ................... 313/506 |
| 2001/0026125 | A1 | 10/2001 | Yamazaki et al. |
| 2001/0045565 | A1 | 11/2001 | Yamazaki |
| 2002/0039871 | A1 | 4/2002 | Hofstra et al. |
| 2003/0067266 | A1 * | 4/2003 | Kim et al. .................. 313/504 |
| 2003/0173897 | A1 | 9/2003 | Iwase et al. |

(Continued)

FOREIGN PATENT DOCUMENTS

CN  1237258 A  12/1999

(Continued)

*Primary Examiner*—Peter Macchiarolo
(74) *Attorney, Agent, or Firm*—Oliff & Berridge, PLC

(57) ABSTRACT

The invention provides an organic EL apparatus including a substrate, a pair of electrodes formed on the substrate, and a light emitting layer disposed between the electrodes is provided in order to implement a light emitting apparatus and an electronic device which decrease reflections in a display of the organic EL apparatus, and to enhance display quality. The substrate includes a transparent substrate, the pair of the electrodes is an anode disposed on the light emitting layer at the substrate side, and a cathode disposed on the light emitting layer at an opposite side of the substrate. A semi-reflection film is disposed near the anode. The semi-reflection film transmits a part of external light incident on the organic EL apparatus from the substrate, and reflects a part of the light other than the light transmitted.

9 Claims, 4 Drawing Sheets

U.S. PATENT DOCUMENTS

| | | |
|---|---|---|
| 2004/0124432 A1* | 7/2004 | Ko .................................. 257/99 |
| 2006/0267485 A1* | 11/2006 | Wood et al. .................. 313/504 |

FOREIGN PATENT DOCUMENTS

| | | |
|---|---|---|
| EP | 0 372 763 A2 | 6/1990 |
| EP | 1 154 676 A1 | 11/2001 |
| GB | 2 353 400 A | 2/2001 |
| JP | A-57-51781 | 3/1982 |
| JP | A-59-194393 | 11/1984 |
| JP | A-63-70257 | 3/1988 |
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |
| JP | A-8-321381 | 12/1996 |
| JP | A-10-255978 | 9/1998 |
| JP | A-11-67448 | 3/1999 |
| JP | A-11-249091 | 9/1999 |
| JP | A-2000-89691 | 3/2000 |
| JP | A-2001-176660 | 6/2001 |
| JP | A-2001-338770 | 12/2001 |
| JP | A-2002-252082 | 9/2002 |
| JP | A-2003-505849 | 2/2003 |
| JP | A-2003-508876 | 3/2003 |
| WO | WO 00/35028 | 6/2000 |
| WO | WO 01/08240 A1 | 2/2001 |
| WO | WO 01/15246 A2 | 3/2001 |
| WO | WO 01/39554 A1 | 5/2001 |

* cited by examiner

[Fig. 1]
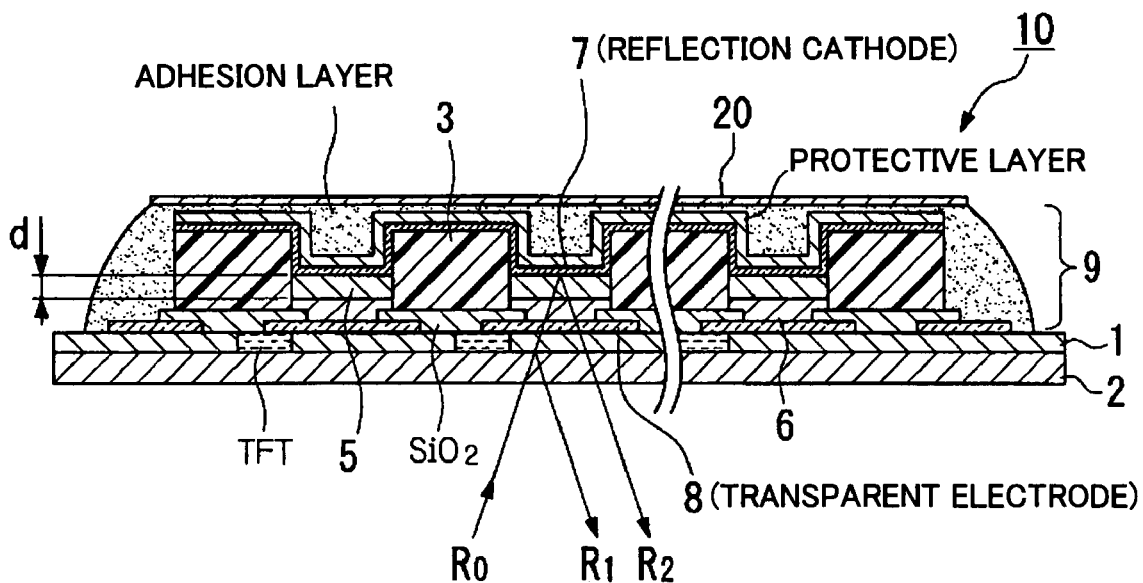
[Fig. 2]
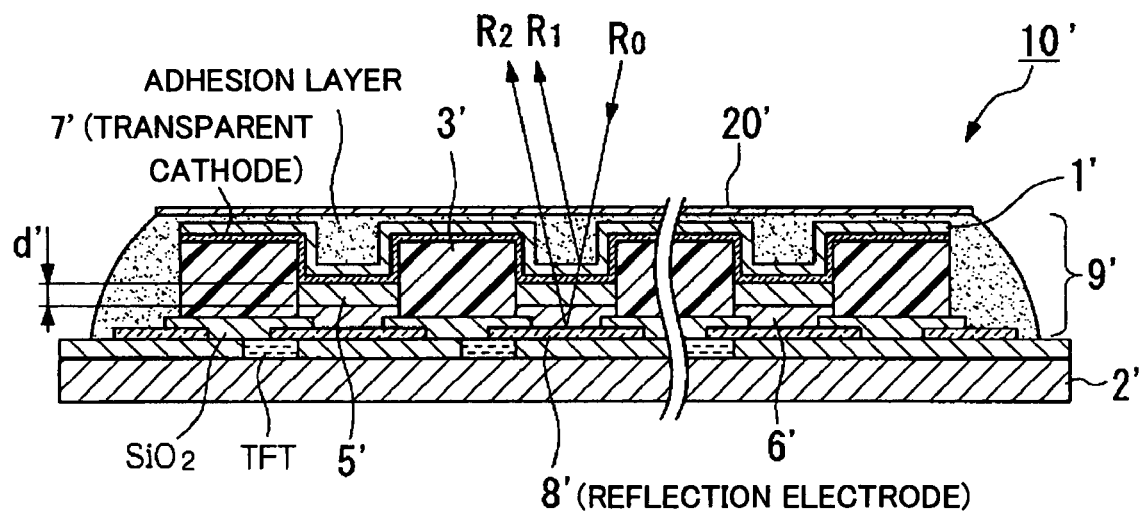

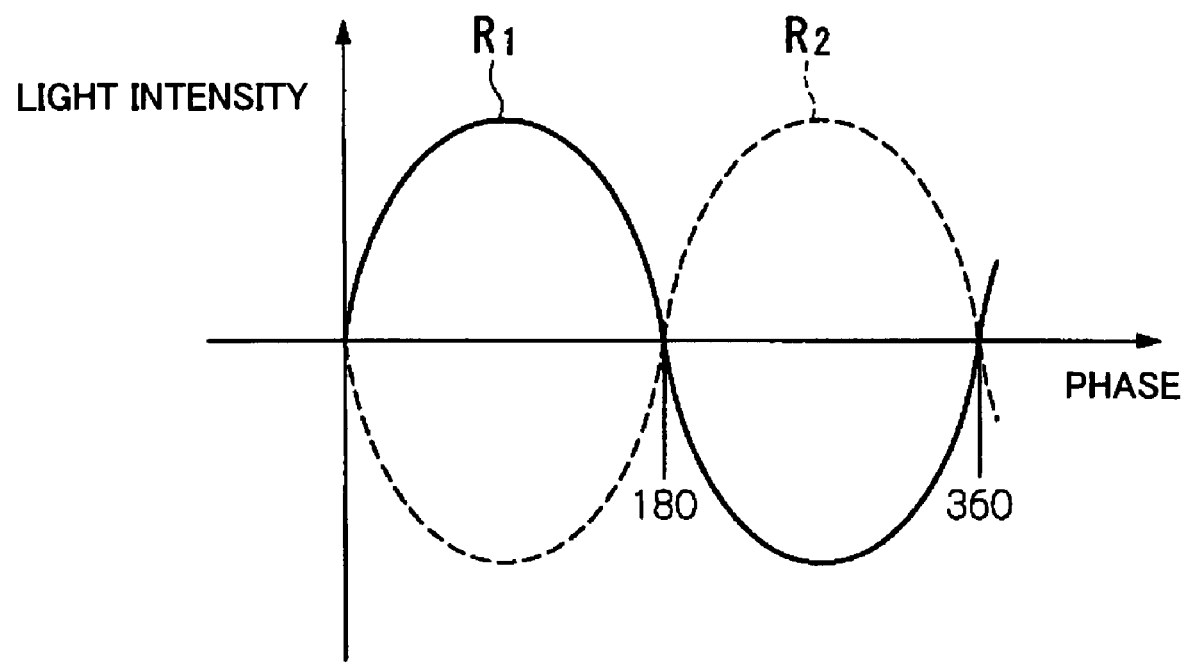
[Fig. 3]

[Fig. 4]
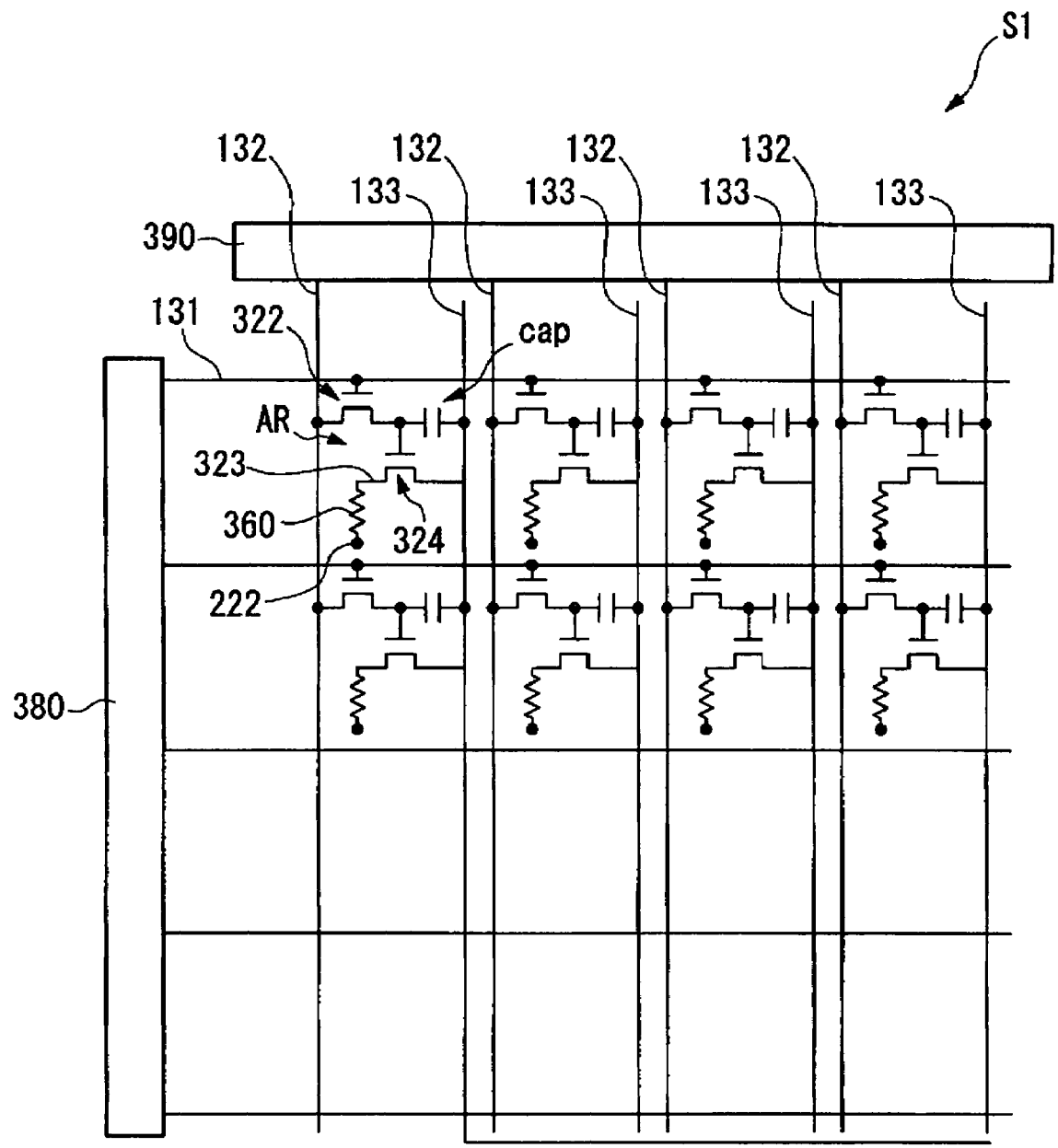

[Fig. 5]
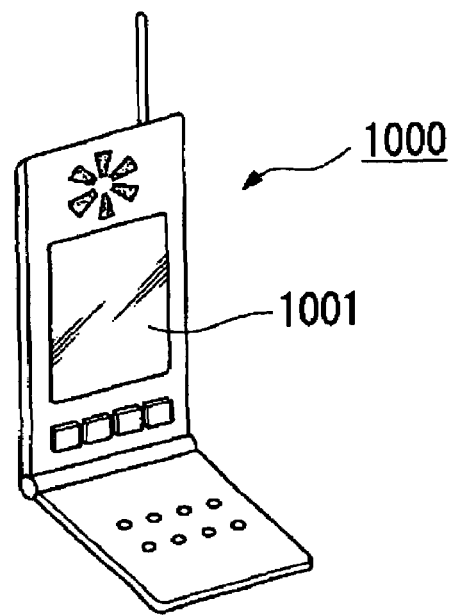
[Fig. 6]
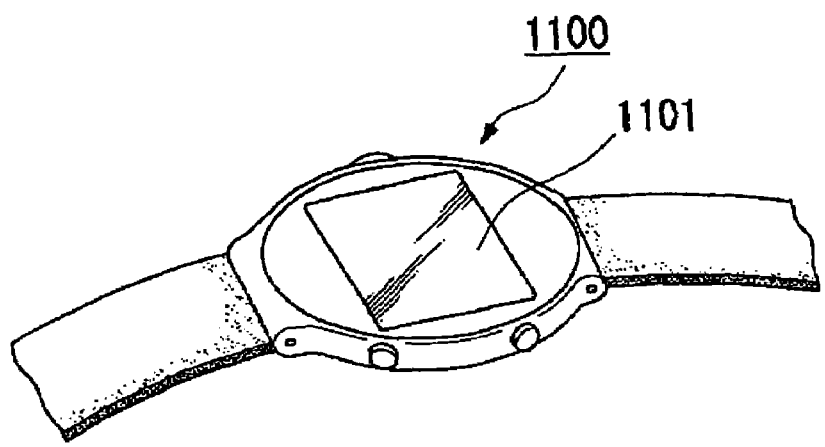
[Fig. 7]
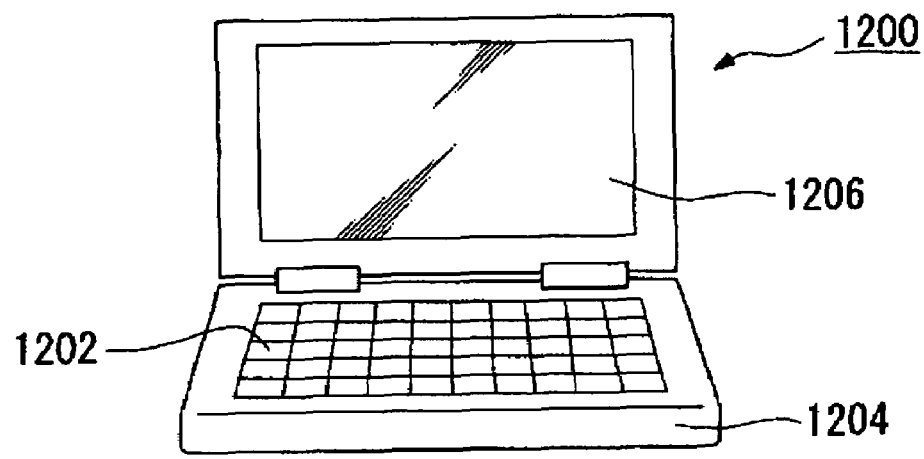

US 7,710,027 B2

LIGHT EMITTING APPARATUS INCLUDING RESIN BANKS AND ELECTRONIC DEVICE HAVING SAME

This is a Continuation of application Ser. No. 10/420,829 filed Apr. 23, 2003. The disclosure of the prior application is hereby incorporated by reference herein in its entirety.

BACKGROUND OF THE INVENTION

1. Field of Invention

The present invention relates to a light emitting apparatus and an electronic device for use in a display of a mobile device, such as a mobile phone, a personal computer or a television.

2. Description of Related Art

In a related art organic electroluminescence (EL) apparatus used as a display, external light is reflected on the display, which results in poor display quality. In order to decrease the reflections on the display, a Blacklayer technology (developed by Luxell Co. Ltd., Canada) can be used. In the related art technology, a transparent electrode, an El layer, a semitransparent electrode, a transparent conductive layer, and a reflective electrode are disposed on one side of a substrate of the organic EL apparatus. The reflections are decreased as follows: a part of light that is transmitted through the transparent electrode and the EL layer is reflected by the semitransparent electrode to be first reflection light. The light other than the first reflection light is transmitted through the semitransparent electrode and the transparent conductive layer, reflected by the reflection electrode, and left from the semitransparent electrode to be a second reflection light. The first reflection light and the second reflection light are interfered each other to weaken reflection intensity at the display.

SUMMARY OF THE INVENTION

In the related art technology, however, to decrease the reflections on the display, the transparent conductive layer is needed to adjust the interference. The transparent conductive layer is composed, for example, of indium tin oxide (ITO). Oxygen is needed to produce the transparent conductive layer. In the manufacturing processes of the organic EL apparatus, ITO should be formed on active metal such as calcium. Thus, in the related art technology to decrease the reflections on the display, the active metal such as calcium is unfavorably almost oxidized upon the ITO formation. Thus, it is very difficult to provide the organic EL apparatus.

The present invention provides a light emitting apparatus and an electronic device that can decrease reflections in a display of an organic EL apparatus, and can enhance display quality.

A light emitting apparatus of the present invention includes, an organic electroluminescence element including a substrate, a first electrode, a second electrode, and a light emitting layer sandwiched between the first and second electrodes. The organic electroluminescence element includes a semi-reflection film that reflects at least a part of light. According to such an apparatus, the first reflection light and the second reflection light can be interfered and attenuated each other. The first reflection light is incident on the light emitting apparatus, reflected by the semi-reflection film and left from the light emitting apparatus. The second reflection light is incident and transmitted through the semi-reflection film, reflected by a cathode or the like, and left from the light emitting apparatus.

Accordingly, in the present apparatus, reflected light of external light incident on the pixel apertures of the light emitting apparatus can be decreased. The present apparatus can display images with high contrast and high quality. The first and second electrodes are a cathode and an anode, respectively.

When the second electrode is disposed at the substrate side, the second electrode has a light transmission property, and the first electrode has a light reflection property, a substrate side light emitting type organic EL apparatus in which light is left from the transparent anode and the substrate can be provided. In this case, the substrate should have light transparency. Preferably, the semi-reflection film disposed on the light emitting layer at the substrate side.

When the second electrode is disposed at the substrate side, the second electrode has a light reflection property, and the first electrode has a light transmission property, a sealed side light emitting type organic EL apparatus in which light is left from the transparent anode and the sealed substrate can be provided. In this case, the sealed substrate should have light transparency. Preferably, the semi-reflection film is disposed on the light emitting layer at the anode side.

Preferably, at least one of the first and second electrodes has a light reflection property, and a thickness of the light emitting layer is set such that first reflection light and second reflection light are interfered and attenuated each other; the first reflection light being incident on the light emitting apparatus and reflected by the semi-reflection film; and the second reflection light being reflected by the electrode having the light reflection property. In such a construction, the thickness of the light emitting layer is adjusted so that the first reflection light and the second reflection light can be interfered. The first reflection light is reflected by the semi-reflection film, and the second reflection light is reflected by the cathode after it is transmitted through the semi-reflection film and the light emitting layer. It is therefore possible to significantly decrease reflections of external light incident on the pixel apertures. In this case, a reflectance of the semi-reflection film may be set such that an intensity of the first reflection light is approximately the same as that of the second reflection light.

At least one of the first and second electrodes has a light reflection property, and a thickness of the light emitting layer is set such that a phase of the first reflection light is deviated from a phase of the second reflection light at an angle of about 180°; the first reflection light being incident on the light emitting apparatus and reflected by the semi-reflection film; and the second reflection light being reflected by the electrode having the light reflection property. With such a construction, the first reflection light and the second reflection light can be interfered and attenuated each other to decrease light intensity to a level of almost "zero". The first reflection light is reflected by the semi-reflection film, and the second reflection light is reflected by the cathode after it is transmitted through the semi-reflection film and the light emitting layer. For example, it is possible to decrease reflections of external light incident on the pixel apertures to the level of "zero". In this case, a reflectance of the semi-reflection film may also be set such that an intensity of the first reflection light is approximately the same as that of the second reflection light.

The light emitting apparatus of the present invention further includes a plurality of pixel apertures on which the light emitting layer is disposed, spaces between the pixel apertures on which the light emitting layer is not disposed, a transparent layer and a reflection layer formed on the spaces between the pixels, a thickness of the transparent layer being set such that a third reflection light and a fourth reflection light are interfered and attenuated each other; the third reflection light being incident on the spaces between the pixels, reflected by the semi-reflection film and left from the spaces between the pixels; and the fourth reflection light being transmitted through the semi-reflection film and the transparent layer, and reflected by the reflection layer. In this case, the semi-reflection film is preferably disposed on the spaces between the pixels. More preferably, the reflectance of the semi-reflection film is set such that an intensity of the third reflection light is approximately the same as that of the fourth reflection light. In such a construction, reflected light of external light incident on not only the pixel apertures of the light emitting apparatus, but also the spaces between the pixels can be significantly decreased. The present apparatus can display images with high contrast and high quality.

The light emitting apparatus of the present invention further includes a plurality of pixel apertures on which the light emitting layer is disposed, spaces between the pixel apertures on which the light emitting layer is not disposed, a transparent layer and a reflection layer formed on the spaces between the pixels, a thickness of the transparent layer being set such that a phase of the third reflection light is deviated from a phase of the fourth reflection light at an angle of about 180°; the third reflection light being incident on the spaces between the pixel apertures and reflected by the semi-reflection film; and the fourth reflection light being transmitted through the semi-reflection film and the transparent layer and reflected by the light reflection layer. In this case, as described above, the semi-reflection film is preferably disposed on the spaces between the pixels. More preferably, the reflectance of the semi-reflection film is set such that an intensity of the third reflection light is approximately the same as that of the fourth reflection light.

In the light emitting apparatus of the present invention, the semi-reflection film preferably transmits about 50 percent of the light incident on the semi-reflection film, and reflects about 50 percent of the light incident thereon.

The light emitting apparatus of the present invention preferably includes a thin film transistor, and the reflection layer functions as an electrode in the thin film transistor. In such a construction, the electrode of the thin film transistor functions as the reflection layer, whereby the manufacturing processes can be simplified, and manufacturing costs can be decreased.

The semi-reflection film may be formed near one of the first and second electrodes, or the transparent first electrode may also act as the semi-reflection film. When the first electrode acting as the semi-reflection film is used as the cathode, calcium (Ca), lithium (Li), magnesium (Mg) and the like can be thin vapor-deposited to produce the cathode. On the other hand, when the first electrode acting as the semi-reflection film is used as the anode, silver (Ag), gold (Au) and the like that have a high work function can be thin vapor-deposited to produce the anode that functions the transparent electrode as well as the semi-reflection film.

The light emitting apparatus of the present invention includes a plurality of scanning lines and a plurality of data lines formed in a matrix, a switching device connected to the scanning lines and the data lines, and pixel electrodes connected to the switching device. The light emitting apparatus as an active display device having such a construction can decrease reflected light of external light incident on the display. The present apparatus can display images with high contrast and high quality.

An electronic device of the present invention includes the above-mentioned light emitting apparatus. The electronic device can decrease reflected light of external light incident on the display thereof, and can display images with high contrast and high quality.

BRIEF DESCRIPTION OF THE DRAWINGS

FIG. 1 is a sectional view showing an organic EL apparatus according to a first exemplary embodiment of the present invention;

FIG. 2 is a sectional view showing an organic EL apparatus according to a second exemplary embodiment of the present invention;

FIG. 3 is a waveform showing the relationship between first reflection light $R_1$ and second reflection light $R_2$;

FIG. 4 is a schematic circuit diagram of an active matrix type display;

FIG. 5 is a schematic that shows an example of an electronic device including an electro-optic apparatus according to the exemplary embodiment of the present invention;

FIG. 6 is a schematic that shows an example of an electronic device including an electro-optic apparatus according to the exemplary embodiment of the present invention;

FIG. 7 is a schematic that shows an example of an electronic device including an electro-optic apparatus according to the exemplary embodiment of the present invention.

DETAILED DESCRIPTION OF PREFERRED EMBODIMENTS

An organic EL apparatus is described below, referring to figures, as an example of a light emitting apparatus according to the present invention. In the present organic EL apparatus, a pair of electrodes, i.e., a transparent electrode and a reflection electrode, sandwiches a light emitting layer. A semi-reflection film is formed near the transparent electrode. Light reflected by the semitransparent film and light reflected by the reflection electrode are interfered, thereby reducing reflections of external light at a display of the organic EL apparatus.

First Exemplary Embodiment

Referring to FIG. 1, an organic EL apparatus according to a first exemplary embodiment of the present invention is described below.

FIG. 1 is a sectional view showing a main part of the organic EL apparatus according to the first exemplary embodiment of the present invention. The organic EL apparatus 10 is a substrate side light emission type that light is emitted from a transparent substrate 2.

The organic EL apparatus 10 includes the transparent substrate 2 that can transmit light, an organic EL apparatus (light emitting element) 9 having a light emitting layer (EL layer) 5 made of an organic electroluminescence material and a positive hole transport layer (positive injection layer) 6 sandwiched between a cathode (reflection electrode) 7, an anode (transparent electrode) 8 formed on one side of the substrate 2, and a sealed substrate 20 to seal the light emitting device. The anode 8 is disposed at the substrate 2 side (at a light emitting side). The cathode 7 is disposed on the light emitting layer 5 at the sealed substrate 20 side (at an opposite side). A sealed layer (protective layer) is disposed between the substrate 2 and the organic EL apparatus 9. A low refractive index layer is disposed nearer the substrate 2 than the sealed layer. The low refractive index layer and the sealed layer may not be disposed. The sealed substrate 20 is adhered to the substrate 2 via an adhesion layer. The organic EL apparatus 9 is sealed between the sealed substrate 20 and the adhesion layer. In the organic EL apparatus 10 of this exemplary embodiment, a semi-reflection film 1 is disposed between the substrate 2 and the anode 8. The semi-reflection film 1 transmits a part of incident light, for example 50 percent of the incident light, and reflects light other than the light transmitted, for example 50 percent of the incident light.

A reflectance or a transmittance of the semi-reflection film 1 is preferably set to satisfy the condition that an intensity of first reflection light $R_1$ is substantially the same as that of second reflection light $R_2$. External light $R_0$ is incident on the organic EL apparatus 10 at the substrate 2 side, is reflected by the semi-reflection film 1, and is left from the organic EL apparatus 10 to be the first reflection light $R_1$. External light $R_0$ is incident on the organic EL apparatus 10 at the substrate 2 side, is transmitted trough the semi-reflection film 1, is reflected by the cathode 7, and is left from the organic EL apparatus 10 to be the second reflection light $R_2$.

In addition, a thickness "d" of the light emitting layer 5 in the organic EL apparatus 10 is preferably set such that a phase of the first reflection light $R_1$ is deviated from a phase of the second reflection light $R_2$ at an angle of about 180°.

For example, when the external light $R_0$ has mainly a wavelength of 520 [nm], the thickness "d" of the light emitting layer 5 is d=wavelength of $R_0/4=520/4=130$ [nm].

As shown in FIG. 3, the relationship between the first reflection light $R_1$ and the second reflection light $R_2$ is as follows: the intensity (amplitude) is the same, and the phases are deviated each other at an angle of 180 degree. Accordingly, the first reflection light $R_1$ and the second reflection light $R_2$ are interfered, and negate each other. As a result, the reflected light radiated from the organic EL apparatus 10 is "zero" relative to the external light $R_0$ being incident on the organic EL apparatus 10.

Second Exemplary Embodiment

Referring to FIG. 2, an organic EL apparatus according to a second exemplary embodiment of the present invention is described below. FIG. 2 is a sectional view showing a main part of the organic EL apparatus according to the second exemplary embodiment of the present invention. The organic EL apparatus 10' is a sealed side light emission type that light is emitted from a sealed substrate 20' made of a transparent glass can or the like.

The organic EL apparatus 10' includes a substrate 2' made of a transparent or non-transparent member, an organic EL apparatus (light emitting element) 9' having a light emitting layer (EL layer) 5' made of an organic electroluminescence material and a positive hole transport layer (positive injection layer) 6' sandwiched between a pair of cathode (transparent electrode) 7' and an anode (reflection electrode) 8' formed on one side of the substrate 2', and a sealed substrate 20' for sealing the light emitting device. The anode (reflection electrode) 8' is disposed on the light emitting layer 5' at the substrate 2' side (at a reflection side). The cathode 7' is disposed on the light emitting layer 5' at the sealed substrate 20' side (at a light emission side).

A sealed layer (protective layer) (not shown) is disposed between the substrate 2' and the organic EL apparatus 9'. A low refractive index layer is disposed nearer the substrate 2' than the sealed layer. The low refractive index layer and the sealed layer may not be disposed. The sealed substrate 20' is adhered to the substrate 2' via an adhesion layer. The organic EL apparatus 9' is sealed between the sealed substrate 20' and the adhesion layer.

In the organic EL apparatus 10' of this exemplary embodiment, a semi-reflection film 1' is disposed on the light emitting layer 5' at the sealed substrate 20' side. The semi-reflection film 1' transmits a part of incident light, for example 50 percent of the incident light, and reflects light other than the light transmitted, for example 50 percent of the incident light.

A reflectance or a transmittance of the semi-reflection film 1' is preferably set to satisfy the condition that an intensity of first reflection light $R_1'$ is substantially the same as that of second reflection light $R_2'$. External light $R_0'$ is incident on the organic EL apparatus 10' at the sealed substrate 20' side. The first reflection light $R_1'$ is reflected by the semi-reflection film 1, and is left from the organic EL apparatus 10'. The second reflection light $R_2'$ is transmitted trough the semi-reflection film 1, is reflected by the anode 8', and is left from the organic EL apparatus 10'.

In addition, a thickness d' of the light emitting layer 5' of the organic EL apparatus 10' is preferably set such that a phase of the first reflection light $R_1'$ is deviated from a phase of the second reflection light $R_2'$ at an angle of about 180°.

For example, when the external light $R_0$ has mainly a wavelength of 520 [nm], the thickness "d" of the light emitting layer 5' is d=wavelength of $R_0/4=520/4=130$ [nm].

The relationship between the first reflection light $R_1'$ and the second reflection light $R_2'$ is the same as the relationship between the first reflection light $R_1'$ and the second reflection light $R_2'$ shown in FIG. 3, and is as follows: the light intensities (amplitude) are the same, and the phases are deviated each other at an angle of 180 degree. Accordingly, the first reflection light $R_1'$ and the second reflection light $R_2'$ are interfered, and negate each other. As a result, the reflected light radiated from the organic EL apparatus 10' is "zero" relative to the external light $R_0'$ being incident on the organic EL apparatus 10'.

Third Exemplary Embodiment

In the above-described first and the second exemplary embodiments, the construction that the reflection light of the external light $R_0$ or $R_0'$ incident on the pixel apertures including the light emitting layer 5 or 5' of the organic EL apparatus 10 or 10' is to be "zero" is described. The organic EL apparatus 10 or 10' has the pixel apertures, and the spaces between the pixels on which the light emitting layer 5 or 5' is not disposed. The spaces between the pixels have a resin bank 3 or 3'. Then, a construction that reflection light of external light incident on the spaces between the pixels is to be "zero" is described below, referring to FIG. 1.

The resin bank 3 disposed on the spaces between the pixels of the organic EL apparatus 10 functions as a partition member upon the formation of the light emitting layer 5 and the positive hole transport layer (positive hole injection layer) 6. The resin bank 3 is formed by, for example, forming a film with a light sensitive insulation organic material, such as polyimide, exposing it with light, developing and curing (firing) it.

A semi-reflection film, a transparent layer and a reflection layer are disposed on the space between the pixels of the organic EL apparatus 10. The semi-reflection film corresponds to the semi-reflection film 1 in the first exemplary embodiment. In other words, similarly to the semi-conductive film 1, the semi-reflection film is formed between the substrate 2 and the anode 8, transmits a part of incident light, for example 50 percent of the incident light, and reflects light other than the light transmitted, for example 50 percent of the incident light similar to the semi-reflection film 1. The transparent layer is disposed on the semi-reflection film at the sealed substrate 20 side. For example, the resin bank 3 may act as the transparent layer. Alternatively, $SiO_2$ formed on the resin bank 3 at the substrate 2 side may act as the transparent layer. Or, the transparent layer may be disposed separately. The reflection layer disposed on the transparent layer at the substrate 2 side has high reflectance. The reflection layer may be a layer that functions as an electrode in a TFT (Thin Film Transistor) structure of the organic EL apparatus 10.

A reflectance or a transmittance of the semi-reflection film is preferably set to satisfy the condition that third reflection light (not shown, which corresponds to the first reflection light $R_1$) has substantially the same intensity as that of fourth reflection light (not shown, which corresponds to the second reflection light $R_2$). External light (which corresponds to the external light $R_0$) is incident on the spaces between the pixels of the organic EL apparatus 10 at the substrate 2 side. The third reflection light is reflected by the semi-reflection film, is reflected by the reflection layer, and is left from the organic EL apparatus 10. The fourth reflection light is transmitted trough the semi-reflection film, and is left from the organic EL apparatus 10.

In addition, a thickness of the transparent layer is preferably set such that a phase of the third reflection light (which corresponds to the first reflection light $R_1$) is deviated from a phase of the fourth reflection light (which corresponds to the first reflection light $R_2$) at an angle of about 180°.

The specific thickness of the transparent layer depends on constituents of the members forming the transparent layer. For example, when the external light $R_0$ has mainly a wavelength of 520 [nm], the thickness of the light emitting layer 5 is=wavelength of $R_0/4=520/4=130$ [nm].

The relationship between the third reflection light and the fourth reflection light is the same as the relationship between the first reflection light $R_2$ and the second reflection film $R_2$ shown in FIG. 3, and is as follows: the intensities (amplitude) are the same, and the phases are deviated each other at an angle of 180 degree. Accordingly, the third reflection light and the fourth reflection light are interfered, and negated each other. As a result, the reflected light radiated from the organic EL apparatus 10 is "zero" to the external light is incident on the organic EL apparatus 10.

Blacklayer may be disposed only on the spaces between the pixels of the organic EL apparatus instead of the semi-reflection film, the transparent layer and the reflection layer.

In the third exemplary embodiment described above, the construction that the reflections in the spaces between the pixels of the substrate side light emission type organic EL apparatus are decreased is described. Alternatively, reflections in the space between the pixels of the sealed side light emitting type organic EL apparatus can also be decreased similar to the substrate side light emission type organic EL apparatus.

(Other Constructions of Organic EL Apparatuses)

Specific construction examples other then the organic EL apparatus 1 or 1' shown in FIGS. 1 or 2 are described below.

In the substrate side light emission type organic EL apparatus 1 shown in FIG. 1, the light emission is taken from the substrate 2 side. Materials of the substrate 2 are light transmissible transparent or semitransparent materials including a transparent glass, quartz, sapphire, or transparent synthetic resins such as polyester, polyacrylate, polycarbonate, and polyetherketone. In particular, inexpensive soda glass is suitably used as the material to form the substrate 2.

On the other hand, in the sealed side light emission type organic EL apparatus 1' shown in FIG. 2, the light emission is taken from the opposite side of the substrate 2' (the sealed substrate 20' side). The substrate 2' may be non-transparent. In this case, ceramic, such as alumina, a metal sheet made of, for example, stainless steel to which an insulation treatment, i.e., surface oxidation, is subjected, thermosetting resin, thermoplastic resin and the like can be used.

The anode 8 shown in FIG. 1 is the transparent electrode including for example, of indium tin oxide (ITO), and can transmit light. The positive hole transport layer (positive hole injection layer) 6 includes, for example, a triphenyl amine derivative (TPD), a pyrazoline derivative, an aryl amine derivative, a stilben derivative, a triphenyl diamine derivative or the like. Specific examples are disclosed in Japanese Unexamined Patent Application Publication Nos. 63-70257, 63-175860, 2-135359, 2-135361, 2-209988, 3-37992, and 3-152184. The triphenyl diamine derivative is preferable. 4,4'-bis(N(3-methylphenyl)-N-phenyl amino)biphenyl is especially preferable.

The positive hole injection layer may be formed instead of the positive hole transport layer. Both of the positive hole injection layer and the positive hole transport layer may be formed. In this case, the materials to form the positive hole injection layer include copper phthalocyanine (CuPc), polytetrahydrothiophenylphenylene, i.e., polyphenylene vinylene, 1,1-bis-(4-N,N-ditolylaminophenyl)cyclohexane, tris(8-hydroxyquinolinol)aluminum and the like. Preferably, copper phthalocyanine (CuPc) is used.

As the material to form the light emitting layer 5 or 5', organic electroluminescence materials including a low molecular organic light emitting pigment, a high molecular light emitter, i.e., various light emitting substances, such as phosphors and phosphorescence substances, $Alq_3$ (aluminum chelate complex) or the like can be used. As a conjugated polymer used as the light emitting substance, one having an arylene vinylene or polyfluorene structure is especially preferable. As the low molecular light emitter, a naphthalene derivative, an anthracene derivative, a perylene derivative, polymethin-, xathene-, coumalin-, and cyanine-based pigments, 8-hydroquinoline and a metal complex derivative, an aromatic amine, a tetraphenylcyclopentadiene derivative, related art or known substances disclosed in Japanese Unexamined Patent Application Publication Nos. 57-51781 and 59-194393 and the like can be used. The cathode 7 is a metal electrode having a low work function made of alkaline earth metals, such as aluminum (Al), lithium (Li), calcium (Ca), magnesium (Mg), strontium (Sr) and barium (Ba), rare earth metals such as ytterbium (Yb) and samarium (Sm), gold (Au), silver (Ag) or the like.

An electron transport layer or an electron injection layer can be disposed between the cathode 7 or 7' and the light emitting layer 5 or 5'. Non-limiting examples of the materials to form the electron transport layer include an oxadiazole derivative, anthraquinodimetane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, 8-hydroxyquinoline and a metal complex derivative and the like. Specific examples are disclosed in Japanese Unexamined Patent Application Publication Nos. 63-70257, 63-175860, 2-135359, 2-135361, 2-209988, 3-37992 and 3-152184. Especially preferable are 2-(4-biphenylyl)-5-(4-t-butylphenyl)-1,3,4-oxadiazole, benzoquinone, anthraquinone, tris(8-quinolinol)aluminum, as well as the material to form the positive hole transport layer described above.

The organic El apparatus 10 or 10' of the exemplary embodiment is an active matrix type (not shown). In practice, a plurality of data lines and a plurality of scanning lines are disposed on the substrate 2 or 2' in a lattice arrangement. In each pixel that is disposed in a matrix defined by the data lines and the scanning lines, the above-mentioned organic El element 9 or 9' is connected via a driving TFT, such as a switching transistor, a driving transistor and the like. Once a driving signal is provided via the data lines or the scanning lines, a current flows between the electrodes. Then, the light emitting layer 5 or 5' of the organic EL element 9 or 9' emits light, the light is emitted to an outer surface of the substrate 2 or to an outer surface of the sealed substrate 20', and the pixel is lighted.

In the first to third exemplary embodiments of the organic EL apparatuses 10 and 10' described above, it is possible to decrease the reflected light of the external light incident on the pixel apertures or the space between the pixels to the level of nearly "zero". Accordingly, the reflections in the display of the organic EL apparatus 10 or 10' can be prevented, and the apparatus can display high contrast and high quality images, when it is used outdoors.

In addition, the organic EL apparatus 10 or 10' do not need to include a transparent conductive layer in order to decrease the reflected light of the external light. Accordingly, the apparatus can be very easily produced, and the production costs can be significantly decreased, as compared with the related art one using the Blacklayer.

FIG. 4 shows an example that the organic El apparatus according to the exemplary embodiment is applied to an active matrix type display device (electro-optic apparatus) using an organic electroluminescence element.

The organic EL apparatus S1 corresponds to the organic EL element 9 or 9' formed on the substrate 2 or 2' shown in FIG. 1 or FIG. 2. As shown a schematic circuit diagram of FIG. 4, a plurality of scanning lines 131, a plurality of signal lines 132 extending in a transverse direction to the scanning lines 131, and a plurality of common electric supply lines 133 extending parallel to the signal lines 132 are provided on the substrate. A pixel (pixel area) AR is provided at each intersect point of the scanning lines 131 and the signal lines 132.

A data line driving circuit 390 including a shift resistor, a level shifter, a video line and an analog switch is connected to the signal lines 132.

On the other hand, a scanning line driving circuit 380 including a shift resistor and a level shifter is connected to the scanning lines 131. At each pixel area AR, there are provided a first transistor 322 where a scanning signal is provided to a gate electrode via the scanning line 131, a retention capacity cap to retain image signals provided by the signal line 132 through the first transistor 322, a second transistor 324 where the image signals retained by the retention capacity cap is provided to a gate electrode, a pixel electrode 323 to which a driving current flows from the common electric supply line 133 when it is electrically connected to the common electric supply line 133 via the second transistor 324, and a light emitting part (light emitting layer) 360 sandwiched between the pixel electrode (anode) 323 and a counter electrode (cathode) 222.

In such a construction, the scanning line 131 is driven to turn on the first transistor 323, a potential of the signal line 132 is retained in the retention capacity cap. The retention capacity cap determines conductive conditions of the second transistor 324. A current flows through the common electric supply line 133 to the pixel electrode 323 via a channel of the second transistor 324, and to the counter electrode 222 through the light emitting layer 360. Thus, the light emitting layer 360 emits light depending on the current flowing therethrough.

(Exemplary Electronic Device)

Examples of electronic devices including the organic EL apparatus (electro-optic apparatus) of the exemplary embodiments described above are described below.

FIG. 5 is a perspective view showing an example of a mobile phone. In FIG. 5, a numeral 1000 is a mobile phone body, and a numeral 1001 is a display including the above-mentioned electro-optic apparatus.

FIG. 6 is a perspective view showing an example of an electronic watch. In FIG. 6, a numeral 1100 is a watch body, and a numeral 1101 is a display including the above-mentioned electro-optic apparatus.

FIG. 7 is a perspective view showing an example of a mobile information processing equipment, such as a word processor or a personal computer, for example. In FIG. 7, a numeral 1200 is an information processing equipment, a numeral 1202 is an input part such as a key board, a numeral 1204 is an information processing equipment body and a numeral 1206 is a display including the above-mentioned electro-optic apparatus.

Since the electronic devices shown in FIGS. 5 to 7 include the electro-optic apparatuses of the above-mentioned exemplary embodiments, the reflection of the external light in the display can be decreased to a level of almost "zero". Even when the devices are used outdoors, it can display high contrast and high quality images.

In addition, the production costs of the display can be significantly decreased. Thus, the production costs of the electronic device can be decreased as compared with the related art one.

The scope of this invention is not unduly limited to the above-mentioned exemplary embodiments. Various modifications can be made without departing from the spirit of this invention. Specific materials and layer structures in the exemplary embodiments are cited for only illustrative purposes, and any suitable alternations can be made.

In the organic EL apparatus 1 or 1' in the above-mentioned exemplary embodiments, the organic EL element 9 or 9' is sealed via the adhesion layer. This invention is not limited thereto. A cavity may be disposed on the cathode 7 or 7' to form a sealing structure, so-called can sealing, without disposing the adhesive layer on the cathode 7 or 7'. In the case of the can sealing structure, a desiccant may be disposed on areas other than the pixel area.

As apparent from the above description, the semi-reflection film is disposed near the anode or the cathode in the light emitting apparatus according to the present invention, the reflection can be decreased in the display of the light emitting apparatus, whereby the display quality can be enhanced.

What is claimed is:

1. A light emitting apparatus, comprising:
   a substrate;
   a semi-reflection film that reflects at least a part of light;
   an organic electroluminescence element including:
      a first electrode;
      a second electrode having a light reflection property; and
      a light emitting layer sandwiched between the first and second electrodes,
   the first electrode being disposed between the light emitting layer and the semi-reflection film; and
   a thickness of the light emitting layer being set so that a first reflection light and a second reflection light interfere and attenuate each other when an external light is incident on the light emitting apparatus, the first reflection light being incident on the light emitting apparatus and reflected by the semi-reflection film, and the second reflection light being reflected by the second electrode.

2. A light emitting apparatus as claimed in claim 1, a reflectance of the semi-reflection film being set such that an intensity of the first reflection light is approximately the same as that of the second reflection light.

3. A light emitting apparatus as claimed in claim 1,
the semi-reflection film transmitting about 50 percent of the light incident on the semi-reflection film, and reflecting about 50 percent of the light incident on the semi-reflection film.

4. A light emitting apparatus as claimed in claim 1,
the semi-reflection film being formed near the first electrode.

5. A light emitting apparatus as claimed in claim 1,
the first electrode capable of reflecting at least a part of light.

6. A light emitting apparatus as claimed in claim 1, further comprising
- a plurality of scanning lines;
- a plurality of data lines;
- switching elements, each of the switching elements connected to one of the scanning lines and one of the data lines; and
- pixel electrodes, each of the pixel electrodes connected to one of the switching elements.

7. An electronic device, comprising the light emitting apparatus as claimed in claim 1.

8. A light emitting apparatus, comprising:
- a substrate;
- a semi-reflection film that reflects at least a part of light;
- an organic electroluminescence element including:
  - a first electrode;
  - a second electrode having a light reflection property; and
  - a light emitting layer sandwiched between the first and second electrodes,
- the first electrode being disposed between the light emitting layer and the semi-reflection film; and
- a thickness of the light emitting layer being set so that a first reflection light and a second reflection light interfere and attenuate each other when a light with a wave length of 520 nm is incident on the light emitting apparatus, the first reflection light being incident on the light emitting apparatus and reflected by the semi-reflection film; and the second reflection light being reflected by the second electrode.

9. An electronic device, comprising the light emitting apparatus as claimed in claim 2.

* * * * *